US006800509B1

United States Patent
Lin et al.

(12) United States Patent
(10) Patent No.: US 6,800,509 B1
(45) Date of Patent: Oct. 5, 2004

(54) PROCESS FOR ENHANCEMENT OF VOLTAGE ENDURANCE AND REDUCTION OF PARASITIC CAPACITANCE FOR A TRENCH POWER MOSFET

(75) Inventors: Ming-Jang Lin, Taichung (TW); Chorng-Wei Liaw, Yunlin (TW); Wei-Jye Lin, Pingtung (TW)

(73) Assignee: Anpec Electronics Corporation, Hsinchu (TW)

( * ) Notice: Subject to any disclaimer, the term of this patent is extended or adjusted under 35 U.S.C. 154(b) by 0 days.

(21) Appl. No.: 10/601,651

(22) Filed: Jun. 24, 2003

(51) Int. Cl.[7] ............... H01L 21/332; H01L 21/336; H01L 21/3205; H01L 21/4763
(52) U.S. Cl. ............... 438/138; 438/259; 438/268; 438/270; 438/589
(58) Field of Search ............... 438/138, 270, 438/259, 268, 212, 272, 700; 257/331, 328

(56) References Cited

U.S. PATENT DOCUMENTS

| | | | | |
|---|---|---|---|---|
| 5,082,795 A | * | 1/1992 | Temple | 438/138 |
| 5,689,128 A | * | 11/1997 | Hshieh et al. | 257/331 |
| 6,433,385 B1 | * | 8/2002 | Kocon et al. | 257/328 |
| 6,455,378 B1 | * | 9/2002 | Inagawa et al. | 438/270 |
| 6,534,367 B2 | * | 3/2003 | Peake et al. | 438/270 |
| 6,660,691 B2 | * | 12/2003 | Ziemer et al. | 504/106 |
| 6,664,163 B2 | * | 12/2003 | Fujishima et al. | 504/106 |
| 6,709,930 B2 | * | 3/2004 | Chan et al. | 438/270 |

* cited by examiner

Primary Examiner—John F. Niebling
Assistant Examiner—Ron Pompey
(74) Attorney, Agent, or Firm—Rosenberg, Klein & Lee (57) ABSTRACT

A process for a trench power MOSFET comprises forming a trench on a semiconductor substrate and an oxide and nitride in the trench, etching the oxide and nitride to remain a part of them at the bottom of the trench, and subsequent procedure for the other structure of the trench power MOSFET. Due to the thick insulator formed at the bottom of the trench, the trench power MOSFET is improved by increased voltage endurance and reduced parasitic capacitance, and thereby the cell density is increased.

12 Claims, 8 Drawing Sheets

FIG. 15 and more particularly, to a process for forming a trench power MOSFET with improved voltage endurance and reduced parasitic capacitance thereof.

BACKGROUND OF THE INVENTION

One type of semiconductor devices formes their gates in a trench, such as trench-gate MOSFET, integrated gate bipolar transistor (IGBT), junction field effect transistor (JFET), and accumulated field effect transistor (ACCUFET). These trench devices have a common characteristic that the structure formed in the trench is exposed to high electric field and the insulator at the bottom of the trench results in effective parasitic capacitance, and these effects restrict the devices shrinked.

The power MOSFET has already been widely used for example in switching power supply (SPS). In modern applications, lower gate charge, higher cell density and lower price are essential requirements for the power MOSFET. Unfortunately, as in the forgoing description, the high electric field the structure in the trench endured and the parasitic capacitance resulted from the insulator restrict the increasing of cell density. Special process and MOSFET structure can be used to increase the cell density but it will also increase manufacture cost. Therefore, power MOSFET with low cost, high cell density and low ON resistance is one of the goal for those who skilled in the art. Williams et al. disclosed a process for trench semiconductor devices in U.S. Pat. Appli. No. 20010026961 to form a thick gate oxide at the bottom of the trench to increase the endurance in high electric field and reduce the parasitic capacitance. However, in this art, to form the thick gate oxide at the bottom of the trench, etching the thick gate oxide is easy to damage the sidewall of the trench and as a result, induces unpredictable effects, such as larger leakage current and easier punch-through at the gate sidewall in the resulted MOSFET. It is therefore desired further improved process.

SUMMARY OF THE INVENTION

An object of the present invention is to provide a process for trench power MOSFET with low gate charge, high cell density and low cost. A process for trench power MOSFET comprises, according to the present invention, forming a trench on a semiconductor substrate and then forming a first oxide, a nitride and a second oxide in the trench that are further etched to remain a part of them at the bottom of the trench before subsequently fabricating the other structure of the power MOSFET. By the inventive process, a thick insulator is formed at the bottom of the trench to improve the endurance of the power MOSFET in high electric field and reduce the parasitic capacitance of the power MOSFET, and thereby the cell density is increased. Particularly, the nitride in the inventive process protects the sidewall of the trench from damages during the formation of the thick oxide at the bottom of the trench by etching the second oxide.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which:

FIG. 1 is a schematic diagram after forming an N– epitaxial layer on an N+ substrate;

FIG. 2 is a schematic diagram after a trench is formed in the N– epitaxial layer, and a thin oxide, a nitride and a thick oxide are formed in the trench;

FIG. 3 is a schematic diagram after etching the oxide on the sidewall of the trench, and coating a photoresist;

FIG. 4 is a schematic diagram after etching the thick oxide, and removing the photoresist;

FIG. 5 is a schematic diagram after etching the nitride and thin oxide;

FIG. 6 is a schematic diagram after forming the gate poly silicon, P well region, N+ source region;

FIG. 7 is a schematic diagram after depositing the insulator and metal;

FIG. 8 is a schematic diagram after forming a trench and N type drain region on a P type substrate;

FIG. 9 is a schematic diagram after forming a nitride and nitride at the bottom of the trench;

FIG. 10 is a schematic diagram after forming the gate oxide;

FIG. 11 is a schematic diagram after depositing the gate poly silicon;

FIG. 12 is a schematic diagram after depositing the insulator to cover on the gate poly silicon;

FIG. 13 is a schematic diagram after etching the insulator to expose the N+ contact region;

FIG. 14 is a schematic diagram after forming the drain poly silicon; and

FIG. 15 is a schematic diagram after forming the metal electrodes.

DETAILED DESCRIPTION OF THE INVENTION

FIGS. 1–7 are cross-sectional views of schematic diagrams for the first embodiment of the present invention, which is a process used to fabricate a trench-gate power MOSFET.

Figure 1:
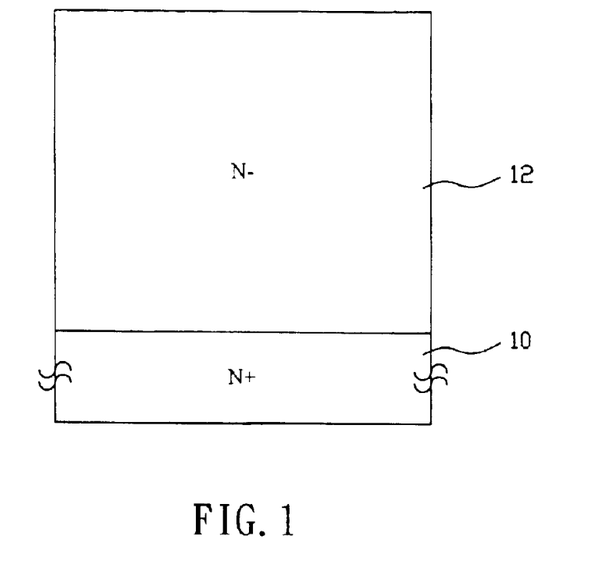
FIGS. 1–7 are cross-sectional views of schematic diagrams for an embodiment process of the present invention to illustrate the fabrication of a trench-gate power MOSFET.
Figure 2:
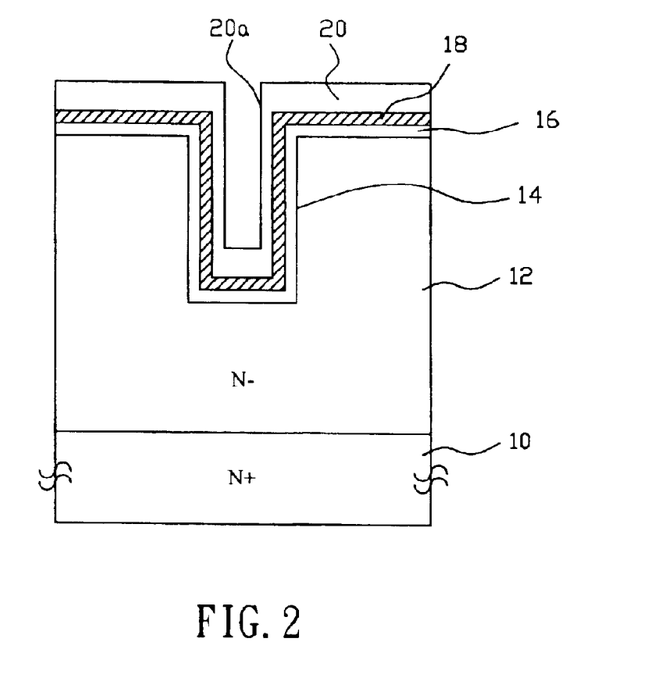
Figure 3:
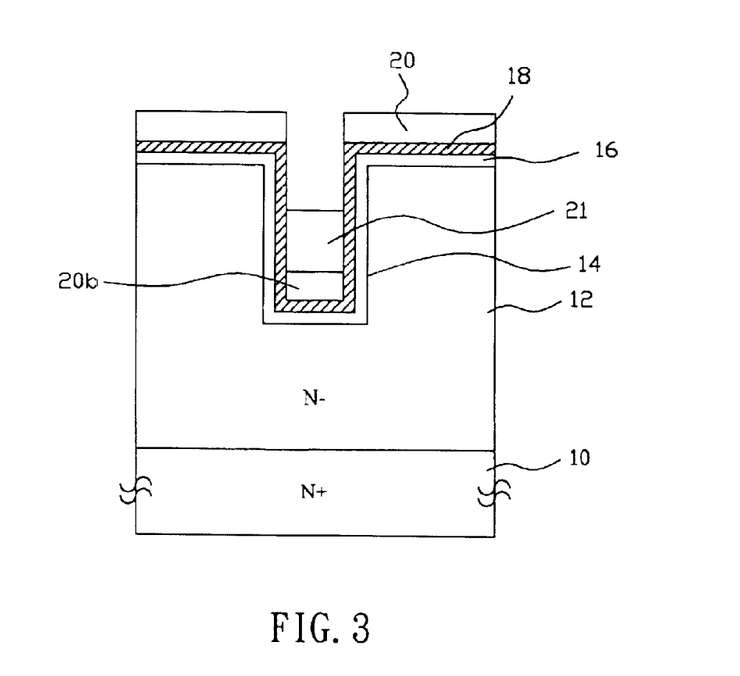
Figure 4:
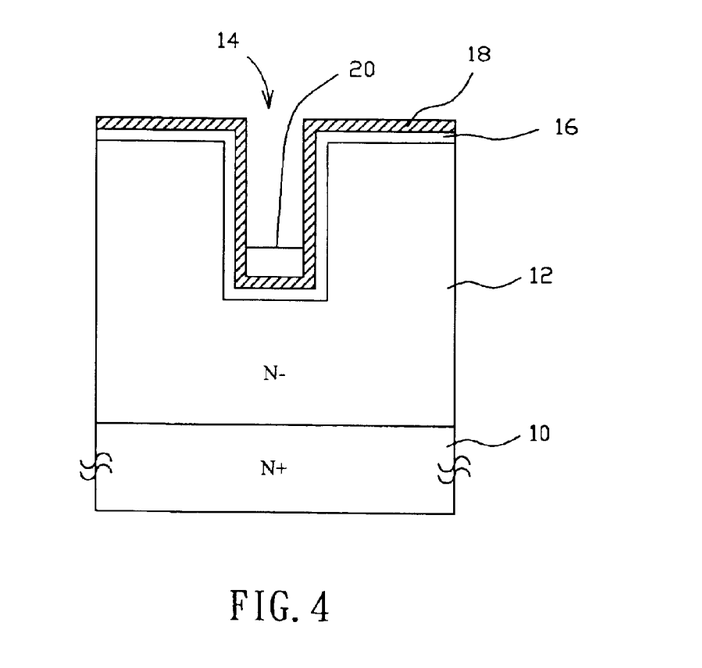
Figure 5:
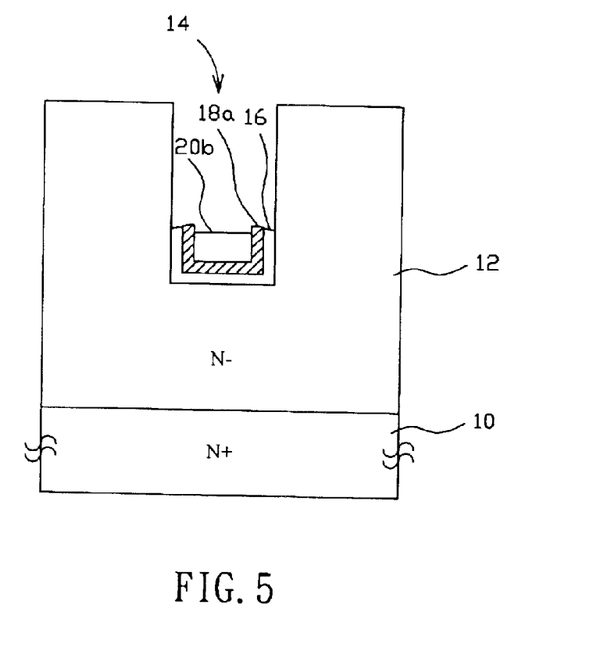
Figure 6:
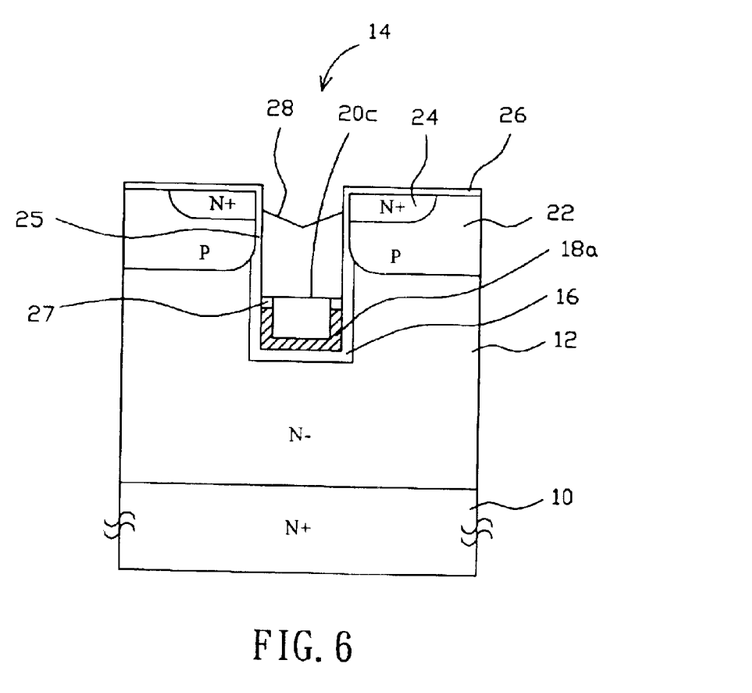
Figure 7:
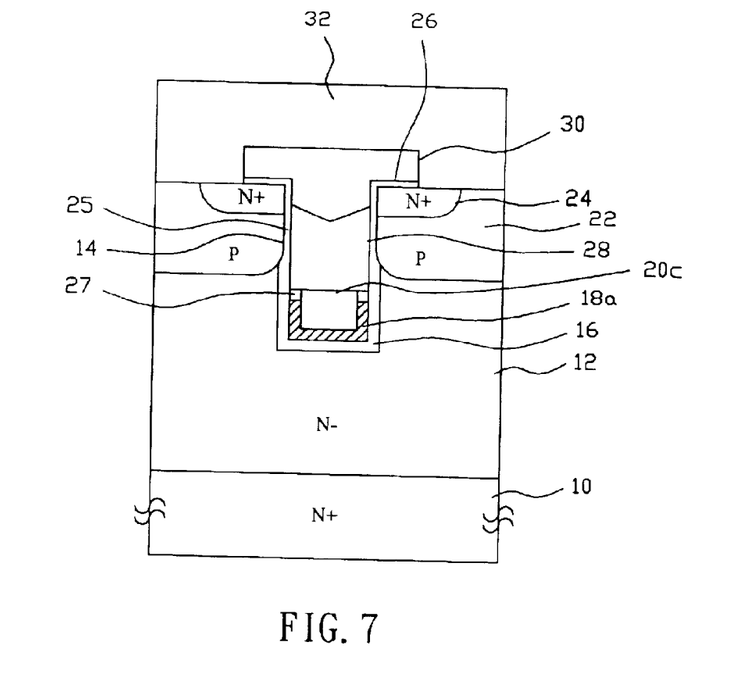

As shown in FIG. 1, an N+ type substrate 10 is prepared with an N– epitaxial layer 12 formed thereon. After etching the epitaxial layer 12 to form a trench 14, as shown in FIG. 2, a thin oxide 16 is formed on the surface of the epitaxial layer 12, and thereon is further deposited with a nitride 18 and a thick oxide 20. The thick oxide 20 is formed by high density plasma (HDP) deposition and as a result, the part 20a of the thick oxide 20 on the sidewall of the trench 14 is thinner than the other part of the thick oxide 20. The thinner oxide 20a on the sidewall of the trench 14 is then removed by wet etching, followed by coating a photoresist 21 in the trench 14 to protect the residue thick oxide 20b at the bottom of the trench 14, as shown in FIG. 3. The thick oxide 20 other than the part 20b at the bottom of the trench 14 is further removed by dry etching, wet etching or chemically mechanical polishing (CMP). After removing the photoresist 21, the structure is shown in FIG. 4. During the above procedure to etch the thick oxide 20 to leave the part 20b remained at the bottom of the trench 14, the nitride 18 protects the sidewall of the trench 14 from damages. Then the nitride 18 is etched to leave only the part 18a remained at the bottom of the trench 14, preferably followed by etching the thin oxide 16 to expose the sidewall of the trench 14 and the surface of the epitaxial layer 12 again, as shown in FIG. 5. Subsequently, the thin oxide 16, nitride 18 and thick oxide 20 are residued only their parts at the bottom of the trench 14. Together with the further growths of an oxide 26 to cover on the top surface of the epitaxial layer 12 and an oxide 25 to cover on the sidewall of the trench 14, the oxides 16 and 20b at the bottom of the trench 14 become thicker simultaneously, and the nitride 18a is covered with an oxide 27. As a result, a much thick insulator 20c is formed at the bottom of the trench 14. A gate conductor 28 is formed in the trench 14 by depositing a polysilicon to fill in the trench 14 and etching back thereto. Two or more doping procedures are performed to form a P type well region 22 and an N+ source region 24 on the P type well region 22 in the epitaxial layer 12, as shown in FIG. 6. An oxide 30 is deposited on the gate conductor 28 and etched to cover to the edge of the trench 14. After depositing a metal 32 to electrically connect the N+ source regain 24 and P well regain 22, a trench-gate power MOSFET is obtained, as shown in FIG. 7, which is a vertical type device with the substrate side for a drain, the epitaxial layer 12 as a drift region, the oxide 25 between the gate conductor 28 and sidewall of the trench 14 as the gate oxide, the region of the P well region 22 adjacent to the sidewall of the trench 14 as the channel region, and the N+ region 24 for the source.

FIGS. 8–15 are cross-sectional views of schematic diagrams for the second embodiment of the present invention, which shows the application of the inventive process to fabricate a trench lateral power MOSFET with trench bottom drain contact.

Figure 8:
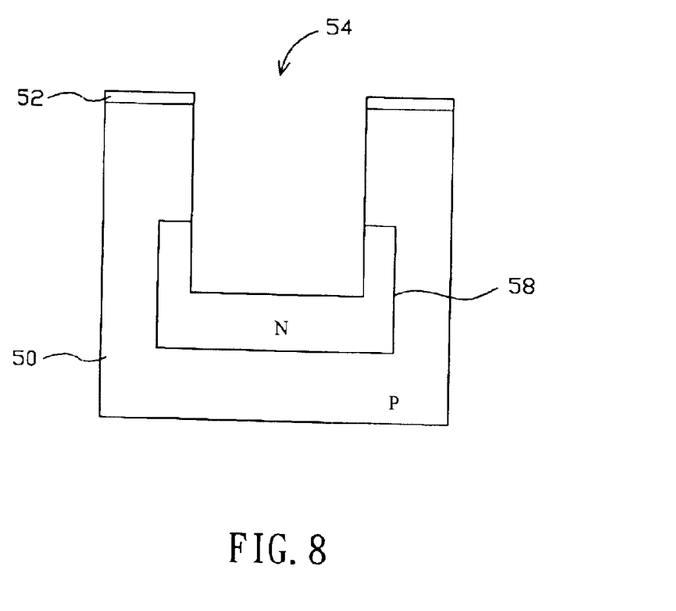
FIGS. 8–15 are cross-sectional views of schematic diagrams for an embodiment process of the present invention to illustrate the fabrication of a trench lateral power MOSFET with trench bottom drain contact.
Figure 9:
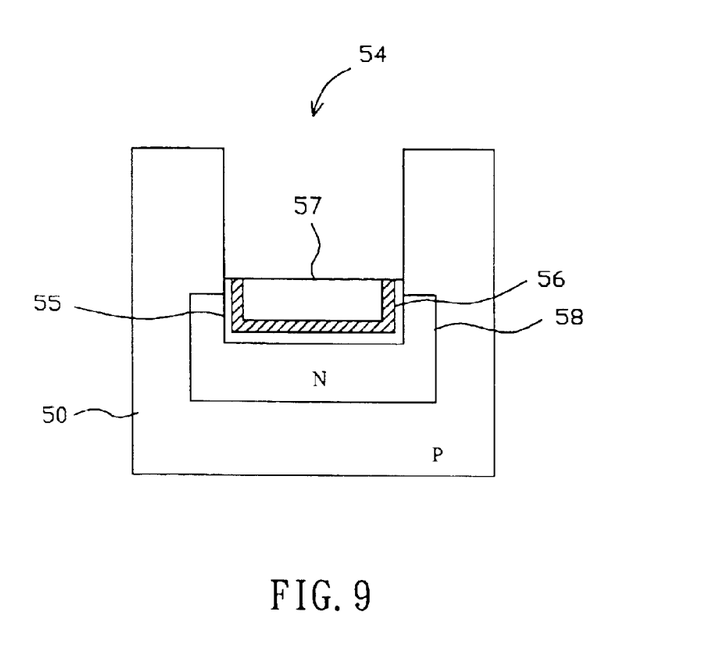
Figure 10:
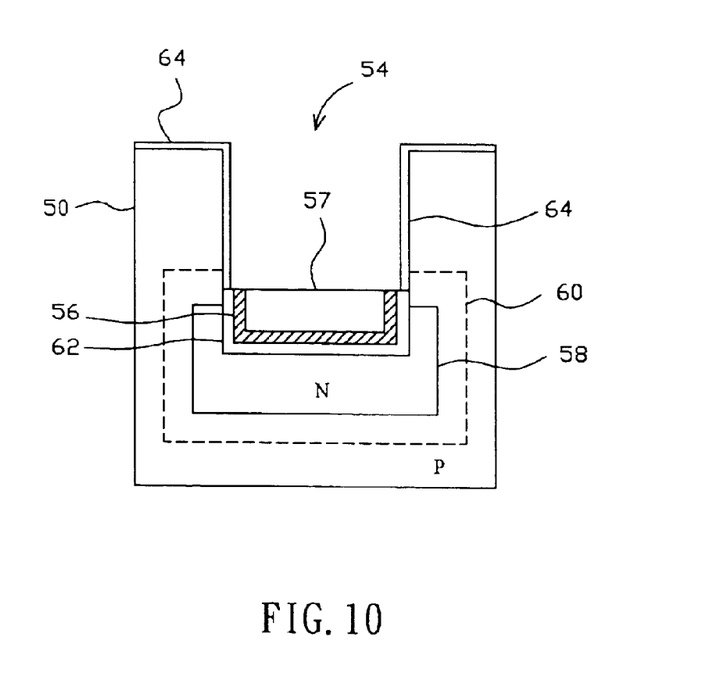
Figure 11:
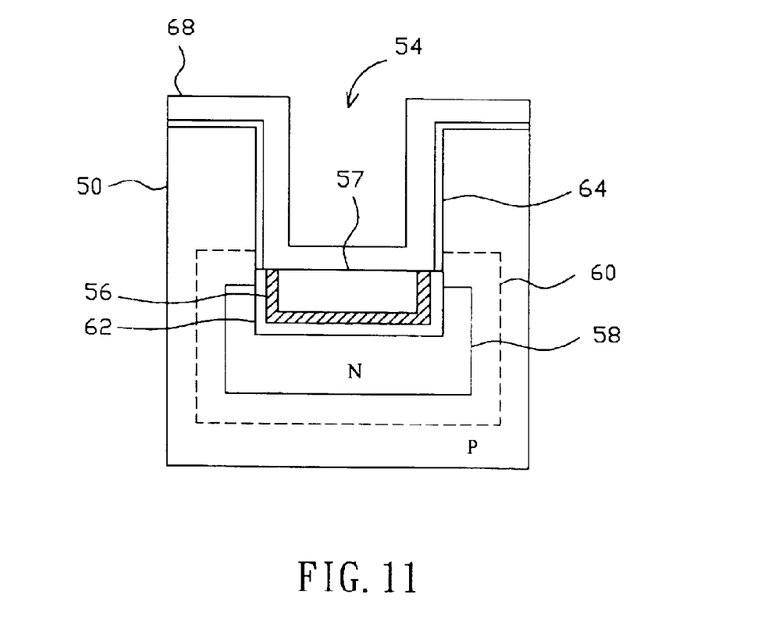
Figure 12:
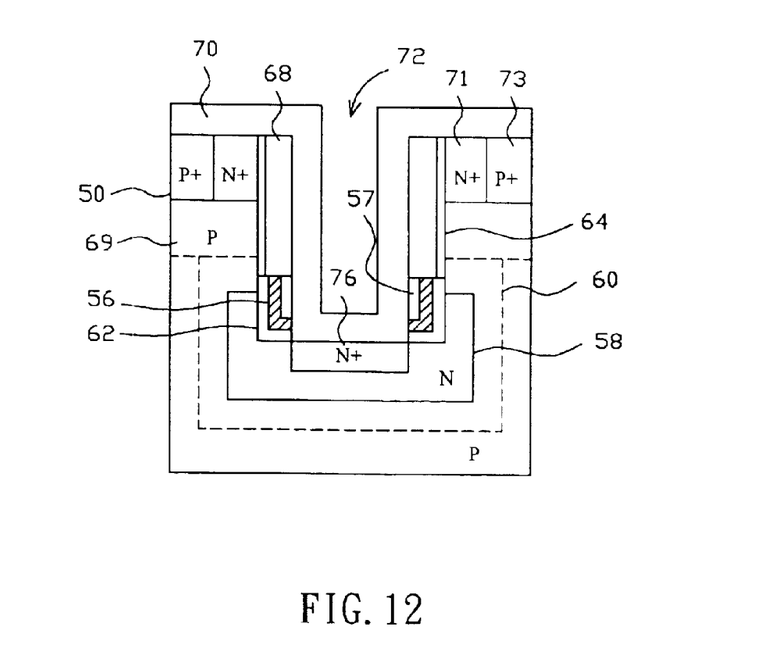
Figure 13:
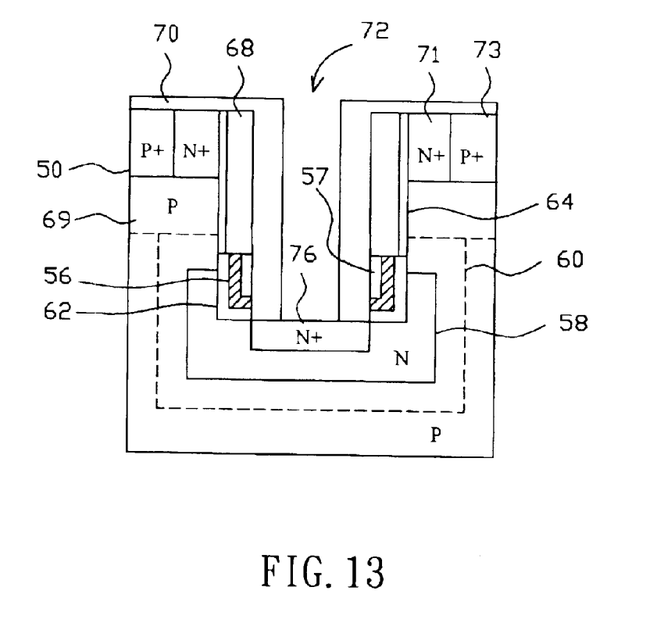
Figure 14:
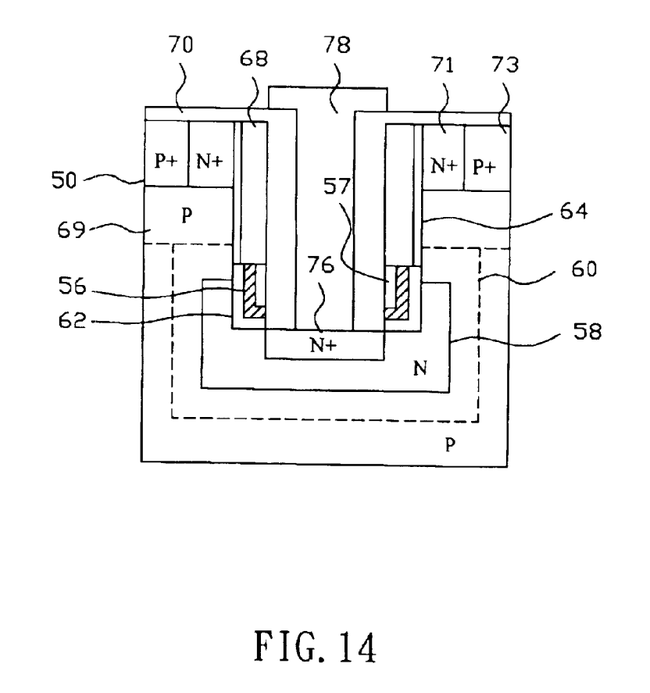
Figure 15:
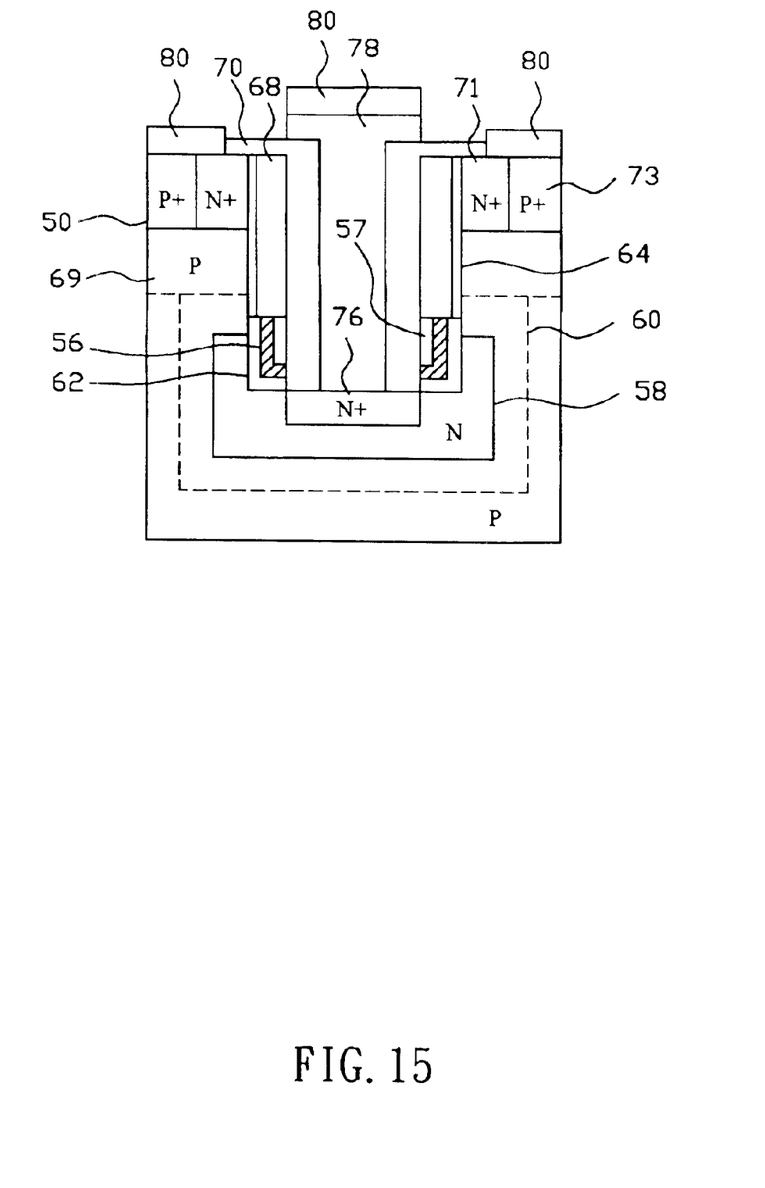

As shown in FIG. 8, a P type substrate 50 formed with an oxide 52 thereon is etched to form a trench 54 by for example reactive ion etching (RIE) and doped at the bottom of the trench 54 to form an N type drain region 58. Preferably, the substrate 50 is further etched through the trench 54 after the bottom of the trench 54 is doped for the trench 54 more deeper into the substrate 50. Alternatively, oblique ion implantation is used to dope the substrate 50 at and near the bottom of the trench 54 after the trench 54 is etched. Steps as shown in FIGS. 2–5 are subsequently performed to form the thin oxide 55, nitride 56 and thick oxide 57 at the bottom of the trench 54, as shown in FIG. 9, and the sidewall of the trench 54 is protected from damages by the nitride during etching in this process, as in the foregoing description. As shown in FIG. 10, the exposed silicon surface is oxidized again to form an oxide 64 whose part on the sidewall of the trench 54 will be used as the gate dielectric, and by this oxidation the thin oxide 55 shown in FIG. 9 becomes thicker as denoted by the oxide 62. It is also shown the P-type body 60 of this device with dashed line in FIG. 10. Then a polysilicon 68 is deposited as shown in FIG. 11 and is etched by for example RIE to remove its parts at the bottom of the trench 54 and at the top of the thin oxide 64 outside the trench 54, respectively, to thereby leave only the part on the sidewall of the trench 54. The oxides 64 and 57, nitride 56 and oxide 62 are further etched to expose the upper surfaces of the N+ drain region 58 and substrate 50. The upper surface of the substrate 50 is then doped to form an N+ source region 71 and a P+ region 73, while the upper surface of the N+ drain region 58 is doped to form an N+ region 76. Under the N+ source region 71 and P+ region 73 is the P-base 69 of this device. After depositing a thick oxide 70, the resultant structure is shown in FIG. 12. The remaining polysilicon 68 is used as the gate conductor, and the trench 54 is shrunk as denoted by the trench 72. Anisotropic etching or RIE is used again to etch the oxide 70 at the bottom of the trench 72 and outside the trench 54, such that an N+ contact region 76 is exposed as shown in FIG. 13. A polysilicon is filled in the trench 72 and is then etched to form a drain conductor 78 electrically connected to the contact region 76, as shown in FIG. 14. As shown in FIG. 15, the oxide 70 is etched again to expose the P+ region 73 and a part of the N+ source region 71, and then a metal 80 is deposited and etched to form the drain and source electrodes. Thus, a trench lateral power MOSFET with trench bottom drain contact is fabricated.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A process for forming a trench-gate power MOSFET, comprising the steps of:

forming a trench deep into a drift layer of a first conductivity type above a substrate of said first conductivity type;

forming a first oxide on a surface of said trench;

depositing a nitride on a surface of said first oxide;

forming a second oxide filled in said trench;

etching said second oxide for leaving a thick oxide at a bottom of said trench;

etching said nitride for remaining a part of said nitride at said bottom of said trench;

forming a gate oxide on a sidewall of said trench;

forming a gate conductor filled in said trench;

forming a well region of a second conductivity type opposite to said first conductivity type adjacent to said sidewall of said trench;

forming a source region of said first conductivity type on said well region;

forming an insulator for covering on said gate conductor and a surface of said source region; and depositing a metal for electrically connecting said source region with said well region.

2. A process according to claim 1, further comprising etching said first oxide after said step of etching said nitride.

3. A process according to claim 1, further comprising forming a third oxide on said nitride and thick oxide before said step of forming a gate conductor.

4. A process according to claim 1, further comprising etching said first oxide before said step of forming a gate oxide.

5. A process according to claim 1, wherein said step of etching said second oxide for leaving a thick oxide on a bottom of said trench comprises the steps of:

etching said second oxide for removing said second oxide from said sidewall of said trench;

coating a photoresist on said second oxide remained at said bottom of said trench;

etching said second oxide not covered by said photoresist; and removing said photoresist for remaining said thick oxide at said bottom of said trench.

6. A process for forming a trench lateral power MOSFET with a trench bottom drain contact, comprising the steps of:

forming a trench on a substrate of a first conductivity type;

doping a bottom of said trench for forming a drain region of a second conductivity type opposite to said first conductivity type;

forming a first oxide on a surface of said trench;

depositing a nitride on said first oxide;

filling a second oxide in said trench;

etching said second oxide for forming a thick oxide at a bottom of said trench;

etching said nitride for leaving a part of said nitride remained at said bottom of said trench;

forming a gate oxide;

forming a gate conductor; etching said second oxide, nitride and first oxide for exposing a surface of said drain region;

forming a source region of said second conductivity type on a surface of said substrate outside said trench;

forming a drain contact region on said exposed surface of said drain region;

depositing an insulator for covering on said gate conductor;

forming a drain conductor electrically connected to said drain contact region; and depositing a metal for forming electrodes.

7. A process according to claim 6, further comprising etching said drain region after said step of doping a bottom of said trench for forming a drain region for said trench more deeper into said substrate.

8. A process according to claim 6, further comprising etching said first oxide after said step of etching said nitride.

9. A process according to claim 8, further comprising oxidation after said step of etching said first oxide.

10. A process according to claim 6, further comprising etching said first oxide before said step of forming a gate oxide.

11. A process according to claim 6, further comprising forming a contact region of said first conductivity type adjacent to said source region.

12. A process according to claim 6, wherein said step of etching said second oxide for forming a thick oxide at a bottom of said trench comprises the steps of:

etching said second oxide for removing said second oxide from said sidewall of said trench;

coating a photoresist on said second oxide remained at said bottom of said trench;

etching said second oxide not covered by said photoresist; and     removing said photoresist for remaining said thick oxide at said bottom of said trench.

\* \* \* \* \*